United States Patent [19]

Spratt et al.

[11] Patent Number: 5,284,788
[45] Date of Patent: Feb. 8, 1994

[54] METHOD AND DEVICE FOR CONTROLLING CURRENT IN A CIRCUIT

[75] Inventors: David B. Spratt; Kueing-Long Chen, both of Plano, Tex.

[73] Assignee: Texas Instruments Incorporated, Dallas, Tex.

[21] Appl. No.: 951,481

[22] Filed: Sep. 25, 1992

[51] Int. Cl.$^5$ ............... H01L 21/70; H01L 27/00
[52] U.S. Cl. .................... 437/52; 437/170; 437/922; 148/55; 148/DIG. 55
[58] Field of Search ............ 437/52, 922, 24; 148/DIG. 55; 257/480, 529, 530

[56] References Cited

U.S. PATENT DOCUMENTS

| | | | |
|---|---|---|---|
| 4,133,704 | 1/1979 | MacIver et al. | 437/11 |
| 4,499,557 | 2/1985 | Holmberg et al. | 257/480 |
| 4,569,121 | 2/1986 | Lim | 437/52 |
| 5,087,589 | 2/1992 | Chapman et al. | 437/195 |
| 5,093,711 | 3/1992 | Hirakawa | 257/763 |

OTHER PUBLICATIONS

"Properties of High Heat-Resistance $\mu c$-SiC$_x$:H Emitter Silicon HBT's", Mamoru Kuwagaki, Kazuo Imai, and Yoshihito Amemiya, *Japanese Journal of Applied Phyics*, May, 1989, pp. L754-L756.

*Primary Examiner*—Olik Chaudhuri
*Assistant Examiner*—H. Jey Tsai
*Attorney, Agent, or Firm*—Christopher L. Maginniss; Richard L. Donaldson

[57] ABSTRACT

A device (10) for controlling current through a circuit has an antifuse material (18) separating a first conductor (12) and a second conductor (20). An insulating element (14) and another insulating element (16) further separate the first conductor (12) from the second conductor (20). The antifuse material (18) includes a dopant which raises the band gap and seals off paths in grain boundaries of the antifuse material (18) in order to limit leakage current from flowing between the first conductor (12) and the second conductor (20). When an interconnection is desired, a high voltage pulse is applied across the first conductor (12) and the second conductor (20) to initially break down the antifuse material (18). The breakdown of the antifuse material (18) causes a filament (22) to form between the first conductor (12) and the second conductor (20). The filament (22) creates a conduction path connecting the first conductor (12) and the second conductor (20) electrically together. Additional current is forced through the antifuse material (18) to permanently set the filament (22) in order to interconnect circuit elements coupled to the first conductor (12) and the second conductor (20).

20 Claims, 1 Drawing Sheet

METHOD AND DEVICE FOR CONTROLLING CURRENT IN A CIRCUIT

BACKGROUND OF THE INVENTION

Electronically programmable circuits require a mechanism to prevent current from flowing through circuit paths not selected by a circuit designer for a desired circuit configuration. Such a mechanism is an antifuse material separating two conductors to prevent current from flowing between the two conductors. However, conventional antifuse materials allow significant leakage current to flow between the two conductors despite a desire to avoid current from flowing between the two conductors. This leakage current affects the functionality of the circuit, precluding proper circuit operation.

From the foregoing, it may be appreciated that a need has arisen for a method and device for controlling current in a circuit that limits leakage current from flowing between two conductors. A need has also arisen to modify the leakage characteristics of an antifuse material by increasing the effective band gap and seal off paths in grain boundaries of the antifuse material. Further, a need has arisen for an antifuse material with low leakage current in order to integrate a larger number of circuit paths without affecting the functionality of the circuit.

SUMMARY OF THE INVENTION

In accordance with the present invention, a method and device for controlling current in a circuit are provided which substantially eliminate or reduce disadvantages and problems associated with electronically programmable circuitry.

The device includes an antifuse material separating two conductors. The antifuse material contains a dopant which increases the band gap of the antifuse material to reduce unwanted current from flowing between the two conductors. The antifuse material prevents a conduction path from forming between the two conductors. When such a conduction path is desired, a high voltage pulse is applied at the two conductors to initially break down the antifuse material, forming a filament between the two conductors. Current starts flowing between the two conductors and the two conductors start fusing electrically together. Additional current is forced through the antifuse material to permanently set the filament, creating a conduction path connecting the two conductors electrically together.

The present invention provides various technical advantages over electronically programmable circuitry within the prior art. For example, one technical advantage is in reducing the leakage current flowing within the antifuse material. Another technical advantage is in raising the band gap and sealing off paths in grain boundaries of the antifuse material by introducing an appropriate dopant into the antifuse material. Still another technical advantage is in the ability to integrate a larger number of conductor pairs without the possibility of high leakage current affecting the functionality of the circuit. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
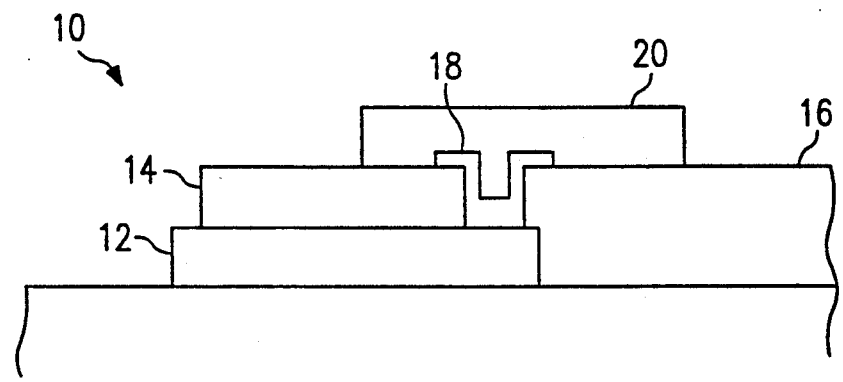
FIG. 1 is a highly magnified schematic sectional view of conductors separated by an antifuse material.

FIG. 1 is a highly magnified schematic sectional view of a circuit portion 10 of the present invention. Circuit portion 10 includes a conduction element 12 beneath insulating material 14 and insulating material 16. An antifuse material 18 separates conduction element 12 from a conduction element 20. Antifuse material 18 prevents current from flowing between conduction element 12 and conduction element 20. Typically, conduction element 12 and conduction element 20 couple to circuit elements comprising a circuit not shown in circuit portion 10 and antifuse material 18 prevents the circuit elements from interconnecting.

Antifuse material 18 can be deposited onto conduction element 12 through a plasma chemical vapor deposition system. Preferably, antifuse material 18 is formed by depositing hydrogenated microcrystalline silicon ($\mu$C-Si:H) onto conductor 12. A dopant is added to the reaction gas mixture of the hydrogenated microcrystalline silicon deposition to form $\mu$C-SiC:H, increasing the band gap of antifuse material 18 and sealing off paths in the grain boundaries within antifuse material 18. By raising the band gap and sealing off grain boundary paths in antifuse material 18, the dopant reduces leakage current which may flow between conduction element 12 and conduction element 20 to a low value. With low leakage current, a larger number of circuit portions 10 may be integrated without affecting the functionality of the overall circuit as may occur without the introduction of a dopant into antifuse material 18. Preferably, $CH_4$ is added to the gas mixture for hydrogenated microcrystalline silicon to increase the band gap of the resulting antifuse material 18, thus reducing leakage current.

Another method of forming antifuse material 18 is to implant a dopant into antifuse material 18 and anneal it to form the resulting dopant material. Preferably, hydrogenated microcrystalline silicon is doped with carbon to form a hydrogenated microcrystalline silicon carbon doped material to improve the leakage characteristics of antifuse material 18. Though carbon is described as the preferable dopant for antifuse material 18, other dopants such a fluorine can also increase the band gap and reduce the dangling bonds within antifuse material 18.

Figure 2:
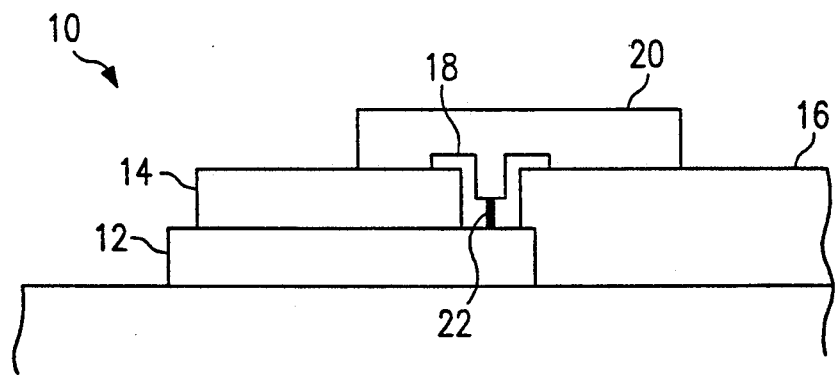
FIG. 2 is a highly magnified schematic sectional view of the antifuse material broken down to form a conduction path between the two conductors.

FIG. 2 is a highly magnified schematic sectional view of circuit portion 10 that has been electronically programmed. A circuit designer, desiring to create a conduction path connecting conduction element 12 and conduction element 20 electrically together, may apply a high voltage pulse across conduction element 12 and conduction element 20, creating enough stress to initially break down antifuse material 18 and starting the conductor fusing process. For circuits having a typical supply voltage of 5 volts, a voltage pulse of 15 to 20 volts can create enough stress to break down antifuse material 18. When this occurs, a filament 22 forms between conduction element 12 and conduction element 20 within antifuse material 18 creating a conduction path connecting conduction element 12 and conduction element 20 electrically together. Additional current is forced through filament 22, causing resistance of antifuse material 18 to go to its lowest value and permanently setting a conduction path between conduction element 12 and conduction element 20. In this manner, circuit elements coupled to conduction element 12 and conduction element 20 are now connected together forming the desired circuit path.

In summary, an antifuse material having improved leakage characteristics is used to control current flowing through a circuit. The antifuse material contains a dopant which widens the band gap and reduces dangling bonds within the antifuse material. As desired, the antifuse material can be broken down by a high voltage pulse to create a conduction path connecting two conductors separated by the antifuse material electrically together.

Thus, it is apparent that there has been provided, in accordance with the present invention, a method and apparatus for controlling current through a circuit that satisfies the advantages set forth above. Although the preferred embodiment has been described in detail, it should be understood that various changes, substitutions, and alterations can be made herein. For example, though the preferred embodiment uses hydrogenated microcrystalline silicon, non-hydrogenated silicon and amorphous silicon may also be used. Further, the desired antifuse material may be deposited by other methods such as by sputtering in a physical vapor deposition process. Also, other dopants may be used other than those described to increase the bandgap of the antifuse material. Other examples are readily ascertainable by one skilled in the art and may be made without departing from the spirit and scope of the invention as defined by the following claims.

What is claimed is:

1. A method of controlling current flow in a circuit, comprising the steps of:
    forming a first conduction element;
    forming an antifuse material on said first conduction element, said antifuse material comprising microcrystalline silicon and a dopant material to reduce leakage current between and to said first conduction element; and
    forming a second conduction element on said antifuse material such that said second conduction element is separated from said first conduction element by said antifuse material.

2. The method of claim 1, further comprising the step of:
    placing an insulating material on said first conduction element to further separate said first conduction element from said second conduction element.

3. The method of claim 2, further comprising the step of:
    applying a voltage pulse across said first and second conduction elements to break down said antifuse material and cause current to flow between said conduction elements.

4. The method of claim 3, further comprising the step of:
    forcing current through said antifuse material to permanently establish an electrical connection between said first and second conduction elements.

5. The method of claim 4, further comprising the step of:
    programming a circuit having a plurality of said antifuse materials by breaking down selective antifuse materials.

6. The method of claim 1, wherein said microcrystalline silicon comprises hydrogenated microcrystalline silicon and wherein said dopant is selected from the group consisting of carbon and fluorine.

7. A method of forming an antifuse between first and second conductors, comprising the steps of:
    forming said first conductor;
    depositing a mixture comprising microcrystalline silicon and a dopant on said first conductor; and
    forming said second conductor on said mixture.

8. The method in accordance with claim 7 wherein said depositing step includes chemical vapor deposition of said mixture.

9. The method in accordance with claim 7 wherein said depositing step includes implanting said dopant into said microcrystalline silicon and annealing said antifuse.

10. The method in accordance with claim 7 wherein said microcrystalline silicon comprises hydrogenated microcrystalline silicon.

11. The method in accordance with claim 7 wherein said dopant comprises carbon.

12. The method in accordance with claim 7 wherein said dopant comprises fluorine.

13. A method of forming an electrically conductive path between two spaced-apart conductors comprising the steps of:
    forming an antifuse in contact with said two conductors, said antifuse comprising a mixture of microcrystalline silicon and a dopant; and
    applying a voltage pulse between said first and second conductors sufficient to break down said antifuse.

14. The method in accordance with claim 13 further comprising the step of:
    forcing current through said antifuse to establish a permanent electrically conductive path between said conductors.

15. The method in accordance with claim 14 further comprising the step of:
    programming a circuit having a plurality of said antifuses by breaking down selective ones of said antifuses.

16. The method in accordance with claim 13 wherein said microcrystalline silicon comprises hydrogenated microcrystalline silicon.

17. The method in accordance with claim 13 wherein said dopant comprises carbon.

18. The method in accordance with claim 13 wherein said dopant comprises fluorine.

19. The method in accordance with claim 13 wherein said forming step includes chemical vapor deposition of said mixture.

20. The method in accordance with claim 13 wherein said forming step includes implanting said dopant into said microcrystalline silicon and annealing said antifuse.

* * * * *